(12) United States Patent
Strang

(10) Patent No.: US 7,544,269 B2
(45) Date of Patent: Jun. 9, 2009

(54) METHOD AND APPARATUS FOR ELECTRON DENSITY MEASUREMENT

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 157 days.

(21) Appl. No.: 10/490,850

(22) PCT Filed: Oct. 24, 2002

(86) PCT No.: PCT/US02/31603

§ 371 (c)(1),
(2), (4) Date: Mar. 26, 2004

(87) PCT Pub. No.: WO03/036309

PCT Pub. Date: May 1, 2003

(65) Prior Publication Data
US 2004/0189325 A1 Sep. 30, 2004

Related U.S. Application Data

(60) Provisional application No. 60/330,555, filed on Oct. 24, 2001, provisional application No. 60/330,518, filed on Oct. 24, 2001.

(51) Int. Cl.
*C23C 16/00* (2006.01)
*C23F 1/00* (2006.01)
*H01L 21/306* (2006.01)
*H01J 7/24* (2006.01)
*H05B 31/26* (2006.01)

(52) U.S. Cl. ............... 156/345.24; 156/345.28; 156/345.41; 118/723 MW; 315/111.21; 315/111.51; 315/111.71

(58) Field of Classification Search ......... 118/723 MW; 156/345.13, 345.15, 345.24
See application file for complete search history.

(56) References Cited

U.S. PATENT DOCUMENTS 3,952,246 A 4/1976 Sprott et al.

(Continued)

FOREIGN PATENT DOCUMENTS

JP WO 01/06544 * 1/2001

(Continued)

*Primary Examiner*—Karla Moore
*Assistant Examiner*—Rakesh K Dhingra
(74) *Attorney, Agent, or Firm*—Oblon, Spivak, McClelland, Maier & Neustadt, P.C.

(57) ABSTRACT

A plasma processing system including a plasma chamber (120) having a substrate holder (128) and a monitoring system (130). The monitoring system (130) includes a microwave mirror (140) having a concave surface (142) located opposite the holder (128) and a power source (160) is coupled thereto that produces a microwave signal perpendicular to a wafer plane (129) of the holder (128). A detector (170) is coupled to the mirror (140) and measures a vacuum resonance voltage of the signal within the chamber (120). A control system (180) is provided that measures a first voltage during a vacuum condition and a second voltage during a plasma condition and determines an electron density from a difference between the second voltage and the first voltage. The processing system (110) can include a plurality of monitoring systems (130a, 130b, 130c) having mirrors (140a, 140b, 140c) provided in a spatial array located opposite the substrate holder (128). A method of monitoring electron density in the processing system is provided that includes loading a wafer, setting a frequency of a microwave signal to a resonance frequency, and measuring a first voltage of the signal during a vacuum condition. The method further includes processing the wafer (114), measuring a second voltage of the signal during a plasma condition, and determining an electron density from a difference between the second voltage and the first voltage.

27 Claims, 9 Drawing Sheets

U.S. PATENT DOCUMENTS

| | | | |
|---|---|---|---|
| 5,115,167 A * | 5/1992 | Ootera et al. | 315/111.21 |
| 5,173,641 A * | 12/1992 | Imahashi et al. | 315/111.41 |
| 5,196,670 A * | 3/1993 | Mantei | 219/121.43 |
| 5,234,526 A * | 8/1993 | Chen et al. | 156/345.42 |
| 5,342,472 A * | 8/1994 | Imahashi et al. | 156/345.42 |
| 5,691,642 A * | 11/1997 | Dobkin | 324/464 |
| 5,705,931 A | 1/1998 | Klick | |
| 5,759,424 A * | 6/1998 | Imatake et al. | 216/60 |
| 5,810,963 A * | 9/1998 | Tomioka | 156/345.28 |
| 5,821,759 A * | 10/1998 | Scaman et al. | 324/529 |
| 6,060,329 A * | 5/2000 | Kamata et al. | 438/9 |
| 6,113,733 A * | 9/2000 | Eriguchi et al. | 156/345.24 |
| 6,184,623 B1 | 2/2001 | Sugai et al. | |
| 6,339,297 B1 * | 1/2002 | Sugai et al. | 315/111.21 |
| 6,472,822 B1 * | 10/2002 | Chen et al. | 315/111.21 |
| 6,861,844 B1 * | 3/2005 | Verdeyen et al. | 324/464 |
| 2001/0019777 A1 * | 9/2001 | Tanaka et al. | 428/472.2 |
| 2003/0052085 A1 * | 3/2003 | Parsons | 216/60 |
| 2004/0033385 A1 * | 2/2004 | Kaushal et al. | 428/627 |
| 2005/0130447 A1 * | 6/2005 | Takaya et al. | 438/780 |

FOREIGN PATENT DOCUMENTS

JP      WO 01/37306    *   5/2001

* cited by examiner

METHOD AND APPARATUS FOR ELECTRON DENSITY MEASUREMENT

CROSS-REFERENCE TO RELATED APPLICATIONS

The present application claims priority and is related to United States provisional Ser. No. 60/330,555, filed on Oct. 24, 2001. The present application claims priority and is related to United States provisional Ser. No. 60/330,518, filed on Oct. 24, 2001. The contents of those applications are incorporated herein by reference.

BACKGROUND OF THE INVENTION

1. Field of the Invention

The present invention generally relates to fabrication of integrated circuits in the semiconductor industry.

2. Discussion of the Background

The fabrication of integrated circuits (IC) in the semiconductor industry typically employs plasma to create and assist surface chemistry within a plasma processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension, etc.).

SUMMARY OF THE INVENTION

The present invention relates to a method and apparatus for monitoring electron density in a plasma processing chamber. The present invention advantageously provides a method and apparatus that enables semiconductor manufacturers to satisfy more stringent performance requirements for material processing equipment used in the semiconductor industry.

The present invention advantageously provides a plasma processing system including a plasma chamber having a substrate holder and a monitoring system for use in the plasma chamber. The monitoring system includes a microwave mirror provided within the plasma chamber. The mirror has a concave surface being located opposite a substrate holder. The monitoring system further includes a power source coupled to the microwave mirror, where the power source is configured to produce a microwave signal extending along an axis generally perpendicular to a wafer plane of the substrate holder. The system includes a detector coupled to the microwave mirror and configured to measure a vacuum resonance voltage of the microwave signal within the plasma chamber. The monitoring system also includes a control system connected to the detector and configured to measure a first voltage during a vacuum condition and a second voltage during a plasma condition. The control system is configured to determine an electron density from the difference in the first and second voltages.

The present invention advantageously provides an alternative processing system that includes a plurality of monitoring systems having mirrors provided in a spatial array located opposite the substrate holder.

The present invention further advantageously provides a method of monitoring electron density in a plasma chamber. The method utilizes a plasma chamber including a microwave mirror having a concave surface located opposite a substrate holder within the plasma chamber, a power source coupled to the microwave mirror and configured to produce a microwave signal extending along an axis generally perpendicular to a wafer plane of the substrate holder, and a detector coupled to the microwave mirror. The method includes the steps of loading a wafer in the plasma chamber, setting a frequency of a microwave signal output from the power source to a resonance frequency, and measuring a first voltage of the microwave signal within the plasma chamber during a vacuum condition. The method further includes the steps of processing the wafer, measuring a second voltage of the microwave signal within the plasma chamber during a plasma condition, and determining the electron density from the difference between the first and second voltages.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1:
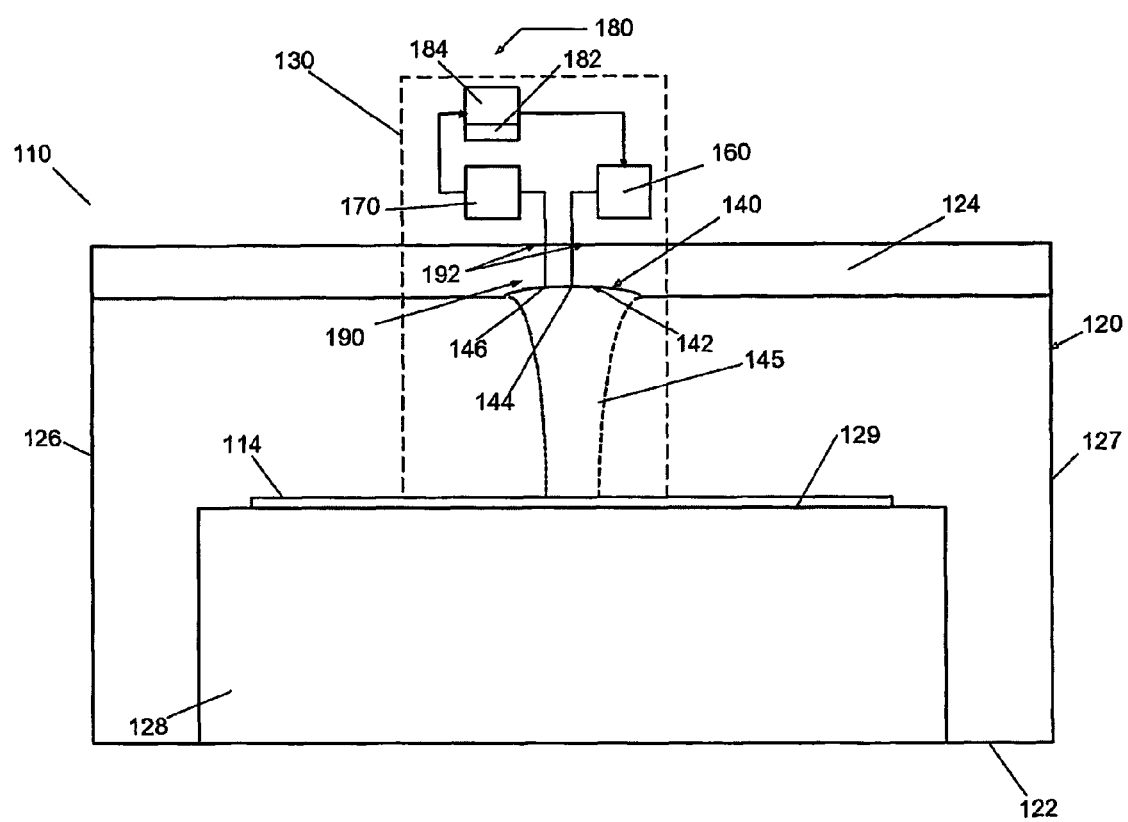
FIG. 1 is a schematic view of an electron density measurement system for a plasma processing chamber according to an embodiment of the present invention.

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

A method of improving the performance of material processing equipment is to monitor and control plasma electron density within the processing chamber during the manufacturing process. Ideally, the plasma electron density is maintained such that the processes being performed are uniformly acting upon the entire surface of the substrate upon which work is being performed.

An exemplary device used to measure plasma electron density is a microwave system of suitably high frequency to exceed the electron plasma frequency. The device includes at least one reflecting surface immersed in the plasma Microwave power is coupled to a multi-modal resonator (e.g. open resonant cavity) and a detector is utilized to monitor the transmission of microwave power through the multi-modal resonator. For a Gaussian beam, cavity transmission occurs at discrete frequencies, and the discrete frequencies correspond to an integer number of half wavelengths between the apex of each mirror, as expressed by the following equation:

$$v_{m,n,q} = v_{0,0,q} = \frac{c}{2nd}\left(q + \frac{1}{2}\right), \quad (1)$$

where $v_{0,0q}$ is a resonant frequency of mode order q (assuming only longitudinal modes, i.e. m=n=0), c is the speed of light in a vacuum, n is the index of refraction for the medium bounded by the mirrors and d is the mirror spacing (apex-to-apex) for the multi-modal resonator. For a vacuum, n=1, however, the presence of plasma or, more specifically, a population of free electrons leads to a reduction of the index of refraction or an observable increase (shift) of the cavity resonance frequencies $v_{0,0,q}$. For a given mode q, the shift in frequency can be related to the index of refraction n and, thereafter, the (integrated) electron density $<n_e>$, is expressed by the following equation:

$$\langle n_e \rangle \cong \frac{8\pi^2 \varepsilon_o}{e^2} v_o \Delta v, \quad (2)$$

for $v_o >> \omega_{pe}/2\pi$. For further details, the use of the above system to measure plasma electron density is described in International App. No. PCT/US00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in their entirety.

An apparatus is now described that enables real-time spatial resolution of the electron density. In an embodiment depicted in FIG. 1, a monitoring system 130 is aligned substantially perpendicular to the wafer plane 129 wherein a first reflecting surface is immersed in the plasma within an upper wall opposite a second reflecting surface. The monitoring system 130 can be, for example, a multi-modal resonator. The first reflecting surface can be, for example, a microwave mirror 140 and the second reflecting surface can be, for example, a substrate 114 and/or substrate holder 128.

An embodiment of a plasma processing system 110 as depicted in FIG. 1 includes a plasma chamber 120 and a monitoring system 130 for use in the plasma chamber 120. The monitoring system generally includes a microwave mirror 140, a power source 160, a detector 170, and a control system 180. The plasma chamber 120 generally includes a base wall 122, an upper wall 124, and side-walls including a first side wall 126 and a second side wall 127. The plasma chamber 120 also includes a substrate holder (or chuck assembly) 128 having a wafer plane 129, such as an upper surface of the substrate holder 128 upon which a substrate 114 is positioned in order to be processed within the plasma chamber 120.

The microwave mirror 140 can have, for example, a concave surface 142 and is provided within the plasma chamber 120. In the embodiment depicted in FIG. 1, the mirror 140 is integrated within the upper wall 124 of the plasma chamber 120. The concave surface 142 of the microwave mirror 140 is oriented opposite the substrate holder 128.

The power source 160 is coupled to the microwave mirror 140 and is configured to produce a microwave signal. The microwave signal or microwave beam 145 produced by the power source 160 extends in a direction generally perpendicular to a wafer plane 129 of a substrate holder 128 adapted to be provided within the plasma chamber 120. The embodiment of the monitoring system 130 depicted in FIG. 1 also includes the detector 170 coupled to the microwave mirror 140. The detector 170 is configured to measure a voltage related to the microwave signal within the plasma chamber 120. The control system 180 is connected to the detector 170 and is configured to measure a first voltage during a vacuum condition, measure a second voltage during a plasma condition, and determine an electron density from the difference between the first and second measured voltages. The control system 180 that includes a lock-on circuit 182 connected to the power source 160 and the detector 170, and can additionally include a computer connected to the lock-on circuit 182.

The upper wall 124 of the chamber 120 includes a waveguide aperture 144 configured to couple the power source 160 to the microwave mirror 140, and a detector aperture 146 configured to couple the detector 170 to the microwave mirror 140. Microwave window assemblies 190 each including a microwave window 192 are provided for both the waveguide aperture 144 and the detector aperture 146. The microwave window assemblies 190 are identical in structure to the microwave window assembly depicted in FIG. 3 to be described below. The microwave windows are implemented to maintain vacuum integrity. Alternately, separate mirrors can be provided for the power source 160 and the detector 170.

Figure 2:
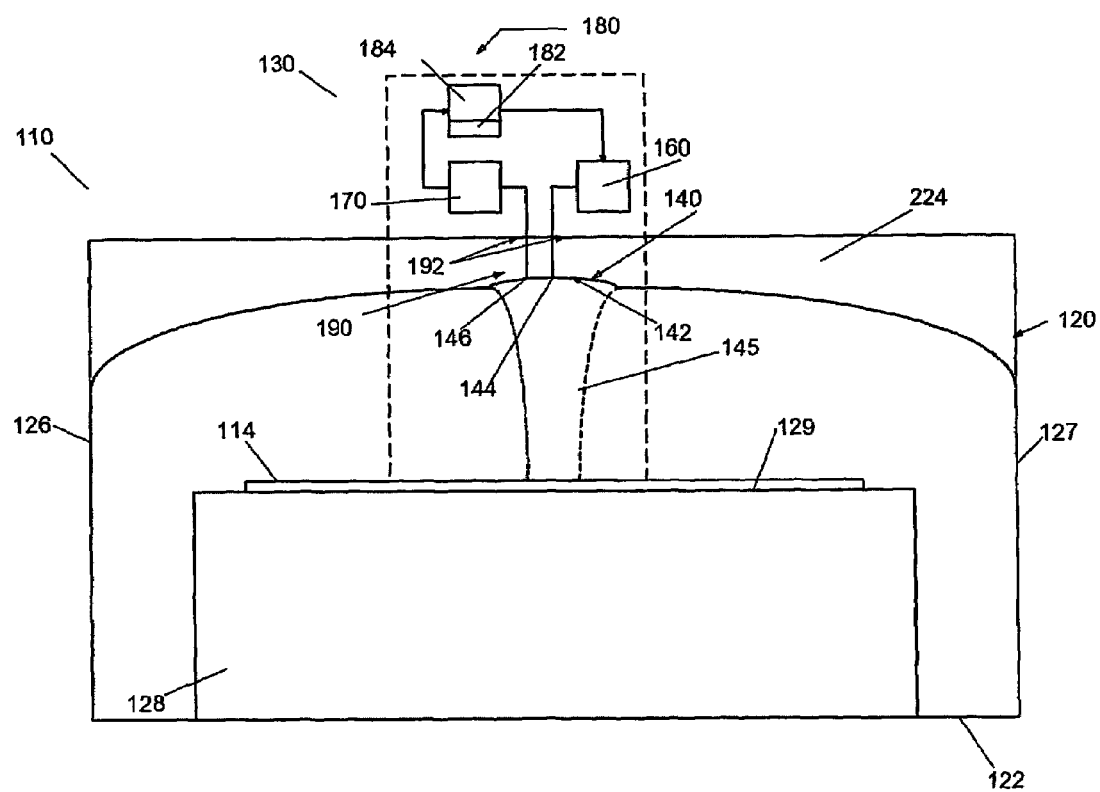
FIG. 2 is a schematic view of an electron density measurement system for a plasma processing chamber according to an embodiment of the present invention.

In an alternate embodiment as depicted in FIG. 2, the upper wall 224 of process chamber 120 can comprise an inner domed surface within which a monitoring system 130 can be formed. In an alternate embodiment, the chamber 120 can be frustoconical.

Figure 3:
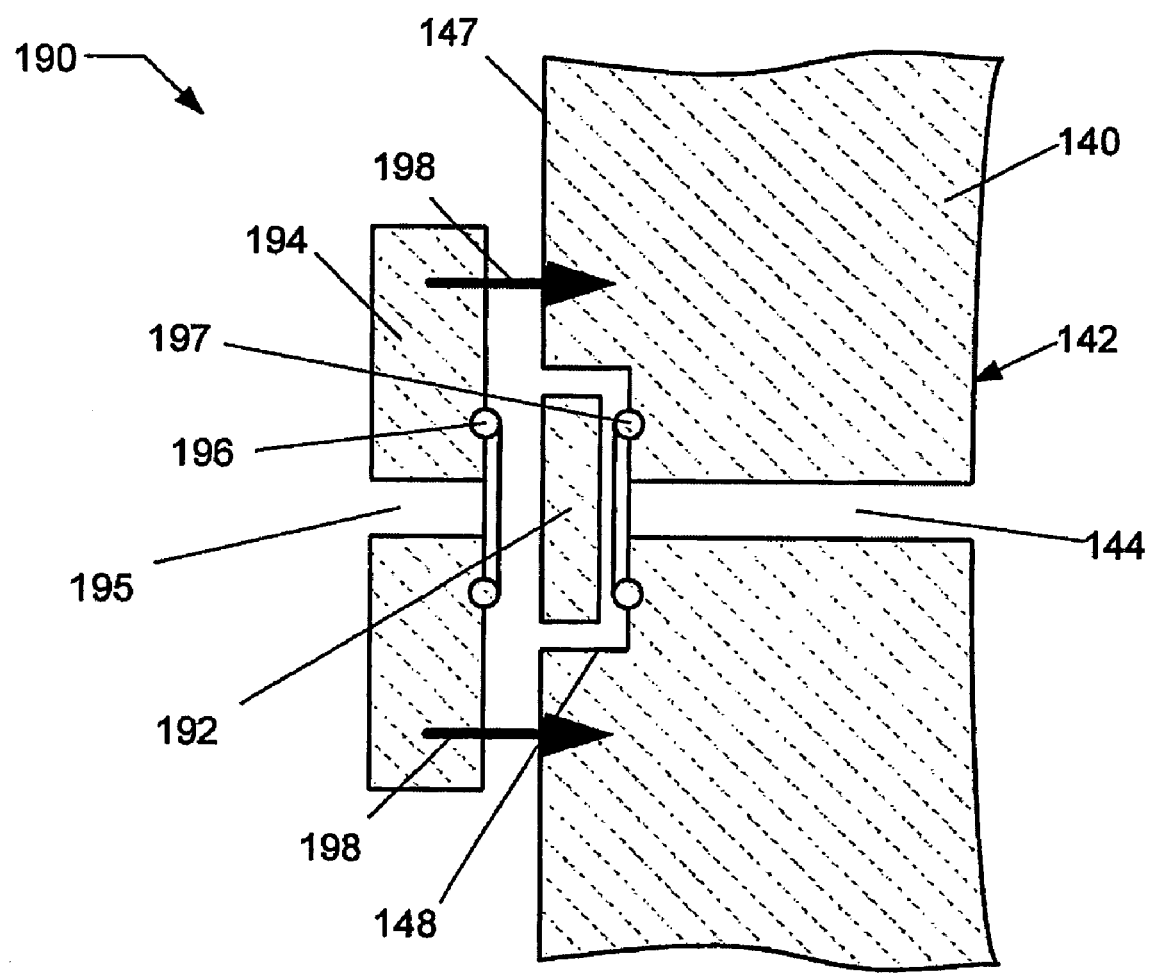
FIG. 3 is an enlarged, exploded, cross-sectional view of a microwave mirror having an aperture, a microwave window and associated mounting structure.

FIG. 3 depicts a detailed schematic of a microwave window assembly 190 for mirror 140, which is used to provide a coupling from the power source 160 through aperture 144. A window assembly 190 having an identical structure is preferably provided for the second aperture 146 in mirror 140, which is used to provide a coupling to the detector 170.

The microwave window assembly 190 depicted in FIG. 3 includes a microwave window 192 that is fastened between a window flange 194 and a rear surface 147 of the microwave mirror 140. In the embodiment depicted in FIG. 3, the window 192 is provided within a recessed portion 148 on the rear surface 147 of microwave mirror 140. The microwave window 192 is provided between a first O-ring 196 provided on the window flange 194 and a second O-ring 197 provided on the rear surface 147 of microwave mirror 140. A plurality of fasteners 198 are provided to mechanically connect the window flange 194 to microwave mirror 140 such that the microwave window 192 is securely mounted to the rear surface 147 of microwave mirror 140. The window 192 is centered on a waveguide aperture 195 extending through the window flange 194 and the waveguide aperture 144 extending through microwave mirror 140. The rectangular waveguide apertures 144 and 195 are sized for a specific microwave band of operation and are fabricated using EDM (electrical discharge machining). The microwave window 192 is fabricated from a dielectric material such as alumina, sapphire, aluminum nitride, quartz, polytetrafluoroethylene (PTFE/Teflon), or Kapton. The window 192 is preferably fabricated from sapphire due to its compatibility with the oxide etch processes.

The microwave mirror 140 is preferably fabricated from aluminum. In alternative embodiments, microwave mirror 140 is anodized with preferably a 10 to 50 micron thick anodization or coated with a material such as Yttria ($y_2O_3$).

The microwave power source 160 is preferably an electronically tunable voltage controlled Gunn diode oscillator (VCO). When the VCO is biased with a direct current voltage, the output frequency can be varied over some spectral range. Therefore, the VCO specifications generally include center frequency, bandwidth and minimum output power. In order to facilitate the use of the above-described system, it is preferred that the VCO bandwidth is at least comparable to the free spectral range (FSR). For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. A 2 GHz bandwidth can be suitable for a spacing (between the upper wall 20 and wafer 35) of approximately 7.5 cm. The bias tuning range can generally extend from +25 V to −25 V, thereby adjusting this bias voltage leads to a change in the output frequency of the VCO. In alternate embodiments, operation at higher frequencies, such as 70 GHz and 105 GHz, can be achieved using a frequency doubler (MUD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In an additional embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of 0 to −25 V. For small mirror spacing (i.e. <5 cm), a microwave input with sufficient power and large bandwidth could be required. In one embodiment, an active multiplier chain is utilized with a low frequency microwave oscillator to achieve bandwidths as great as plus or minus 12 GHz. For example, an active multiplier chain for use in the range of 75 to 100 GHz is a Model AMC-10-R000that is commercially available from Millitech, LLC. In general, the power should be sufficiently high to achieve a usable signal-to-noise ratio for the diagnostic, however, the power should not be increased above tens of milliwatts in order to avoid wafer damage.

The detector 170 is preferably a general purpose diode detector such as those commercially available from Millitech, LLC. For example, a DXP-15-RNFW0 and a DXP-10-RNFW0 are general purpose detectors in the V-band (50 to 75 GHz) and W-band (75 to 110 GHz), respectively.

Figure 4:
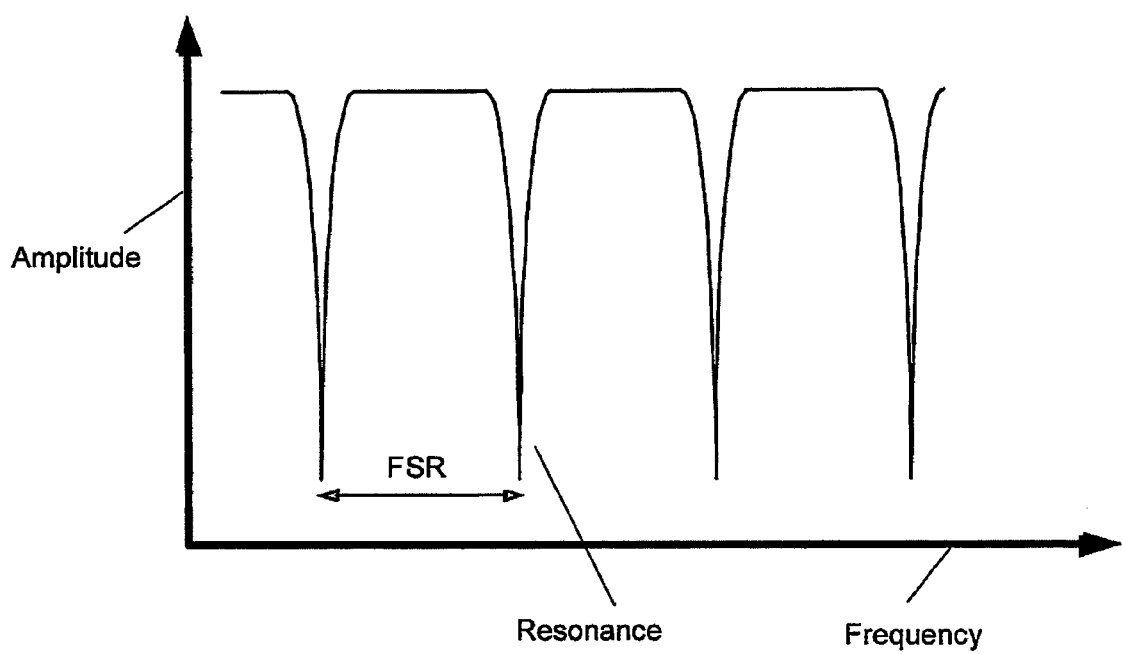
FIG. 4 is a graphical representation of an exemplary cavity transmission function showing several longitudinal resonances and a respective free spectral range.

The embodiment of the present invention depicted in FIG. 1 has a control system 180 that includes a lock-on circuit 182 connected to the power source 160 and the detector 170, and a computer 184 connected to the lock-on circuit 182. The lock-on circuit 182 can be utilized to lock the frequency of the microwave signal output from the microwave power source 160 to a pre-selected cavity resonance. The lock-on circuit 182 superposes a dither signal (e.g. 1 kHz, 10 mV amplitude square wave) on a direct current voltage substantially near the voltage and related output VCO frequency that corresponds with a pre-selected longitudinal frequency in the monitoring system 130 of FIG. 1 (i.e. when the output frequency falls within the resonance envelope, an error signal can be produced to move the output frequency of the VCO to the frequency associated with the resonance peak). The signal detected by the detector 170 is provided to the lock-on circuit 182, where it represents a first derivative of the cavity transmission function (transmitted power versus frequency). The signal input to the lock-on circuit 182 from the detector 170 provides an error signal by which the direct current component of the VCO bias voltage is adjusted to drive the VCO output frequency to the frequency associated with the peak of a pre-selected longitudinal resonance as shown in FIG. 4. FIG. 4 presents an exemplary cavity transmission function (from a negative polarity detector) indicating several longitudinal resonances and the respective free spectral range (FSR). The cavity transmission as shown in FIG. 4 can be obtained by sweeping the VCO across a suitable frequency range sufficiently greater than the FSR.

As described above, the introduction of plasma within the chamber 120 causes a shift in frequency for each of the resonances shown in FIG. 4 (i.e. each of the resonances shift to the right in FIG. 4 when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in wafer processing, the direct current bias voltage is recorded once a new wafer is received by the process tool for materials processing and prior to the ignition of plasma Hereinafter, this measurement will be referred to as the vacuum resonance voltage. Once the plasma is formed, the direct current bias voltage is obtained as a function of time for the given wafer and the time varying voltage difference or ultimately electron density (via equation (2)) is recorded.

Figure 5:
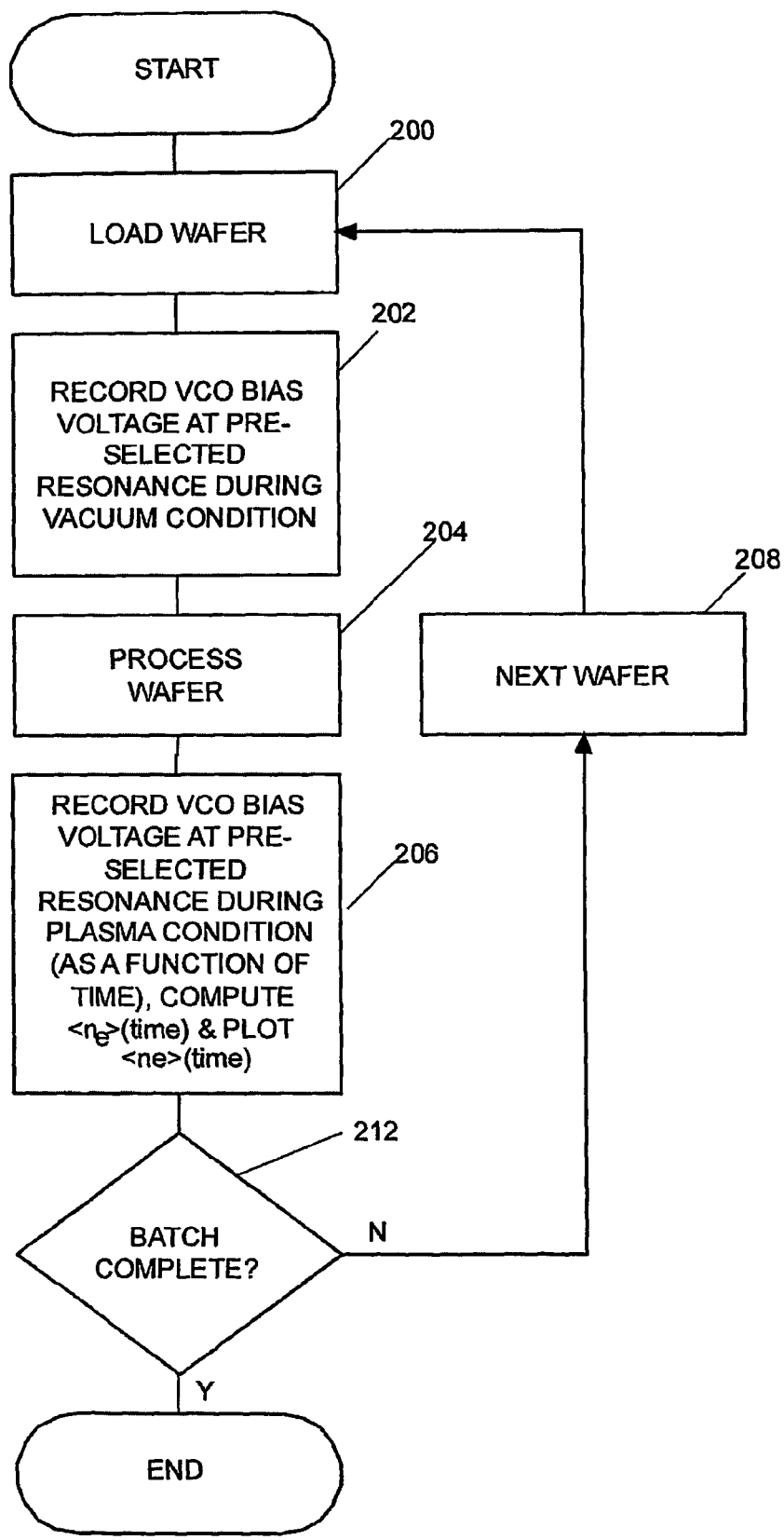
FIG. 5 is a flow diagram of a method of monitoring electron density in a plasma processing chamber according to an embodiment of the present invention.

FIG. 5 is a flowchart of a method of monitoring the bias voltage representative of electron density from wafer-to-wafer utilizing the systems described in FIGS. 1 and 2. The process begins with a step 200 of loading a wafer and preparing the chamber for process conditions (i.e. evacuating the chamber, initiating gas flow, etc.). Once the wafer is loaded, a cavity resonance is selected and the lock-on circuit is programmed to lock the VCO output frequency to the selected resonant frequency. The VCO bias voltage corresponding to the pre-selected resonance during a vacuum condition is measured in step 202 and the process proceeds according to a process recipe stored on the process computer in step 204. During the process in step 206, a second VCO bias voltage under a plasma condition is measured as a function of time, a difference between the second VCO bias voltage and the first VCO bias voltage is computed as a function of time, an electron density is determined from the voltage difference per equation (2), and the electron density is displayed through a graphical user interface (GUI) as a function of time during the process. The measurements of steps 202 and 206 can be, for example, a single signal comprising the measured voltage as a function of time. When the process is complete, the status of the batch is evaluated in step 212. If the batch is incomplete, a next wafer is processed in step 208 and steps 200 through 212 are repeated. If the batch is complete in step 212, a subsequent batch can be processed.

The present invention provides a method of monitoring electron density in a plasma chamber, such as that depicted in FIGS. 1 and 2. For example, the plasma chamber 120 includes a microwave mirror 140 having a concave surface 142 located opposite a substrate holder 128 within the plasma chamber 120, a power source 160 coupled to the microwave mirror 140 and configured to produce a microwave signal extending along an axis generally perpendicular to a wafer plane 129 of the substrate holder 128, and a detector 170 coupled to the microwave mirror 140. The method of the present invention includes the steps of loading a wafer 114 in the plasma chamber 120, setting a frequency of a microwave signal output from the power source 160 to a resonance frequency, and measuring a first voltage of the microwave signal during a vacuum condition within the plasma chamber 120 using the detector 170. The method further includes the steps of processing the wafer 114, measuring a second voltage of the microwave signal during a plasma condition within the plasma chamber 120 using the detector 170, and determining an electron density (per equation (2)) from a difference between the second measured voltage and the first measured voltage.

The configuration described above and depicted in FIGS. 1, 2, 3 and 5 enables the measurement of the integrated electron density in a monitoring system 130 within the influence of the microwave beam. In addition to monitoring the integrated plasma density at a single region above substrate 114, an alternate embodiment can be configured to monitor the plasma density at more than one location above substrate 114. The process uniformity which is strongly affected by the uniformity of the plasma density is critical in achieving maximum yield and quality of devices across an entire 200 mm to 300 mm wafer (and larger).

Figure 6:
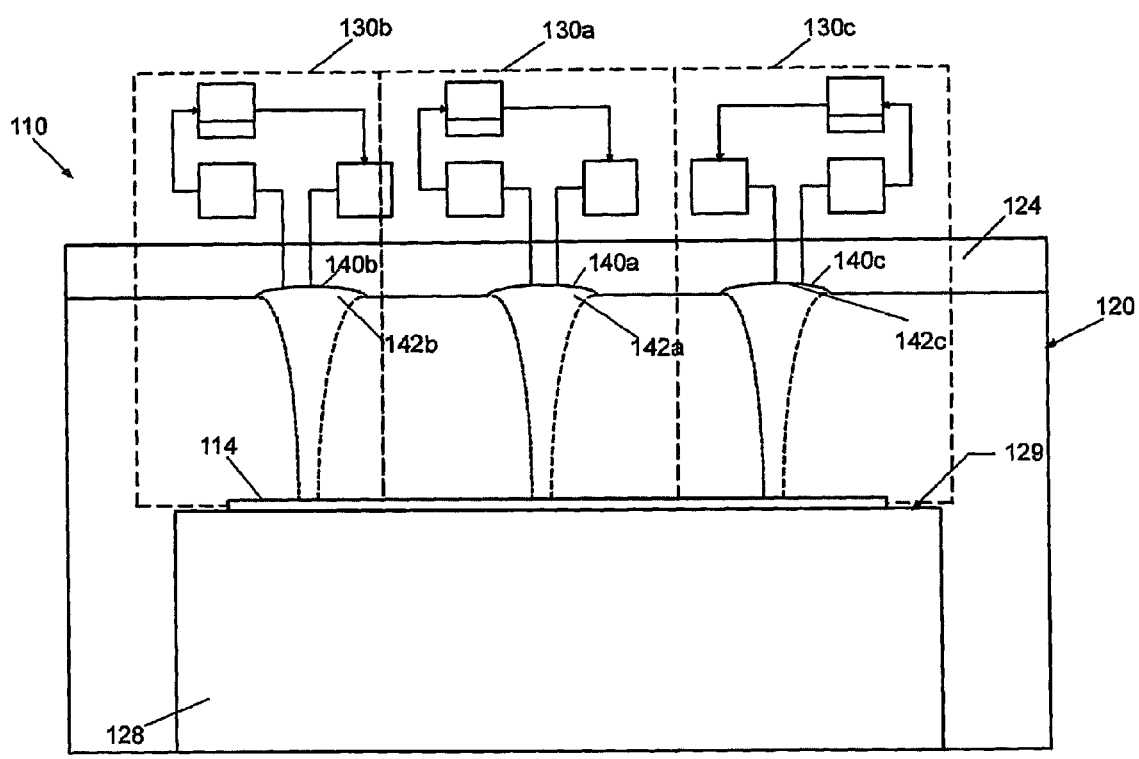
FIG. 6 is a schematic view of a multi-site electron density measurement system for a plasma processing chamber according to an alternative embodiment of the present invention.

In an alternate embodiment as depicted in FIG. 6, a plurality of monitoring systems 130a, 130b, and 130c substantially identical to those described above are employed with respective mirrors 140a, 140b, and 140c to achieve spatially resolved electron density measurements. The plurality of monitoring systems 130a, 130b, and 130c include microwave mirrors 140a, 140b, and 140c that are provided in a spatial array located opposite the substrate holder 128. The monitoring systems of such an array can be operated by simultaneously using the method of monitoring electron density in a plasma chamber as depicted in FIG. 1. In such a configuration, the electron density can be determined at multiple sites above the substrate 114, and these measurements can be, for example, correlated with the process performance parameters (i.e. spatial distribution of etch rate, etch selectivity, etc.). The multi-site measurement of electron density can ultimately be employed to diagnose the uniformity of a process.

In the embodiment depicted in FIG. 6, a linear array of mirrors is provided, however, other configurations of the mirror array can be utilized to provide for an even distribution of monitoring systems above the substrate holder 128, as discussed later with respect to FIG. 9.

Figure 7:
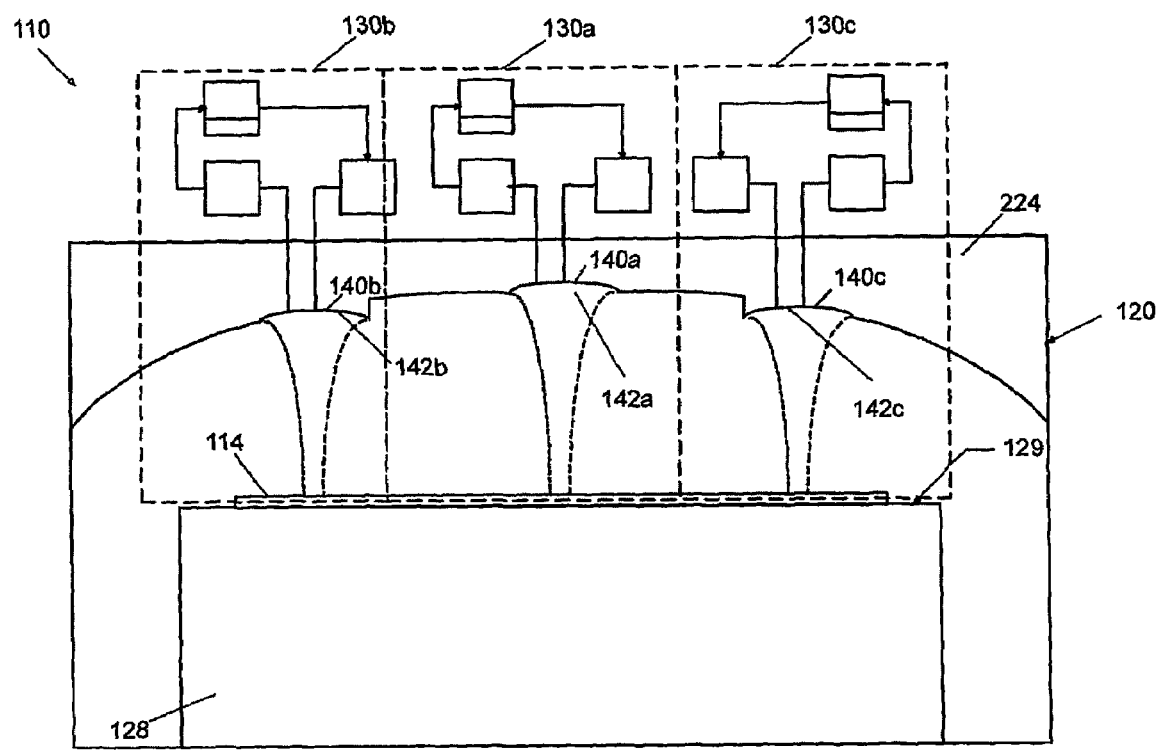
FIG. 7 is a schematic view of a multi-site electron density measurement system for a plasma processing chamber according to an alternative embodiment of the present invention.

In an alternate embodiment as depicted in FIG. 7, the upper wall 224 of process chamber 120 can be curved; a plurality of monitoring systems 130a-c can be formed within the curved wall. In an alternate embodiment, the chamber 120 can be frustoconical.

Figure 8:
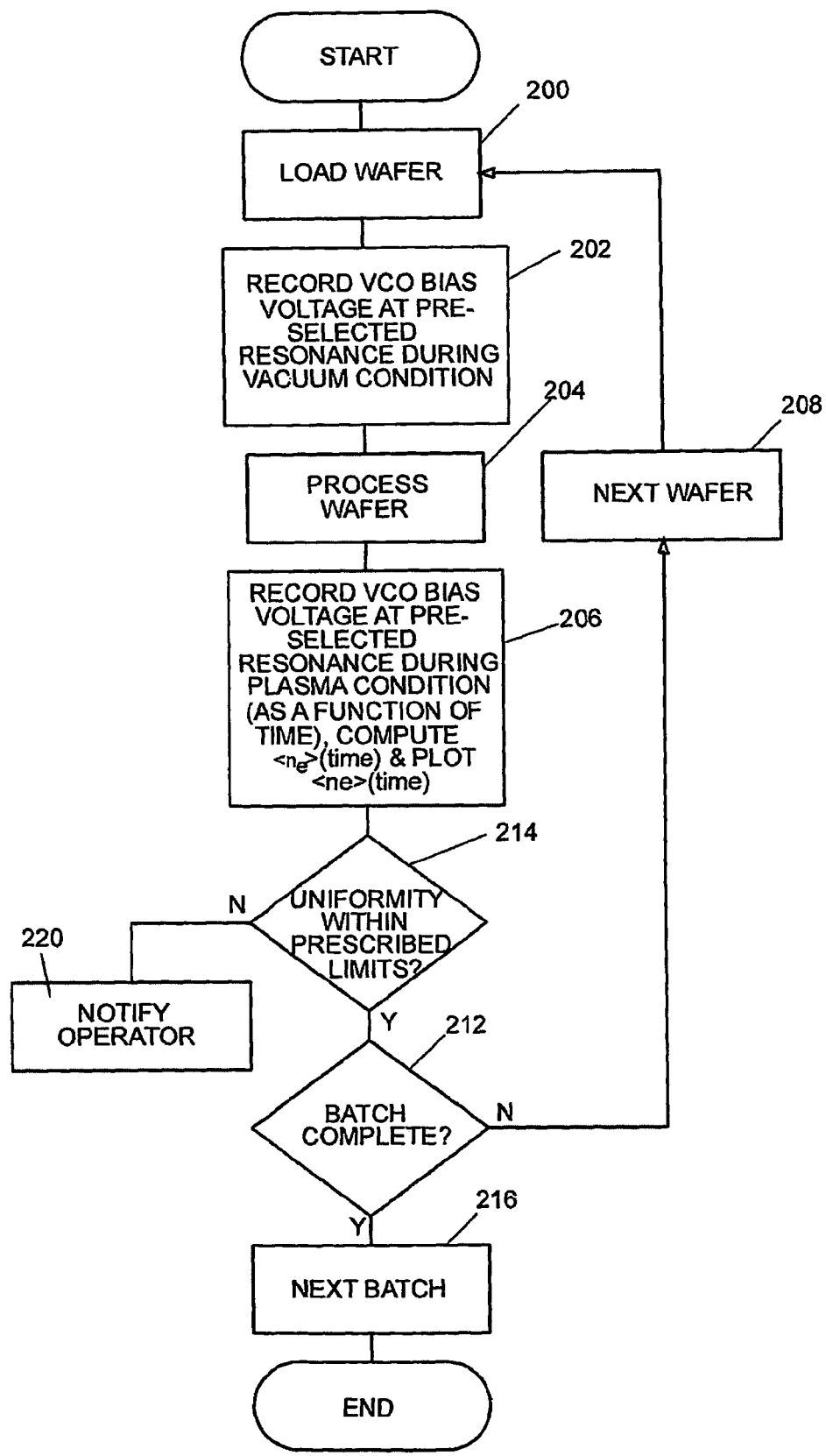
FIG. 8 is a flow diagram of a method of monitoring electron density at multiple sites in a plasma processing chamber according to an embodiment of the present invention.

FIG. 8 is a flowchart of a second method of monitoring the bias voltage representative of electron density from wafer-to-wafer utilizing the system described in FIG. 5. The process begins with a step 300 of loading a wafer and preparing the chamber for process conditions (i.e. evacuating the chamber, initiating gas flow, etc.). Once the wafer is loaded, a cavity resonance is selected and the lock-on circuit is programmed to lock the VCO output frequency to the selected resonant frequency for each multimodal resonator 130(a-c) in FIGS. 6 and 7. The VCO bias voltage corresponding to the pre-selected resonance during a vacuum condition is measured in step 302 (i.e. for each multi-modal resonator 130a-c) and the process proceeds according to a process recipe stored on the process computer in step 304. During the process in step 306, a second VCO bias voltage under a plasma condition is measured as a function of time, a difference between the second VCO bias voltage and the first VCO bias voltage is computed as a function of time, an electron density is determined from the voltage difference per equation (2), and the electron density is displayed through a graphical user interface (GUI) as a function of time during the process. Step 306 is repeated for each multi-modal resonator (130a-c) in FIGS. 6 and 7. The measurements of steps 302 and 306 can be, for example, a single signal comprising the measured voltage as a function of time. At the completion of processing for a given wafer, the uniformity of the electron density is computed and a determination of whether the uniformity is within prescribed limits is made in step 314. If the uniformity of electron density exceeds the prescribed limit, then an operator is notified in step 220. When the process is complete, the status of the batch is evaluated in step 312. If the batch is incomplete, a next wafer is processed in step 308 and steps 300 through 314 are repeated. If the batch is complete in step 312, a subsequent batch can be processed in step 316.

Figure 9:
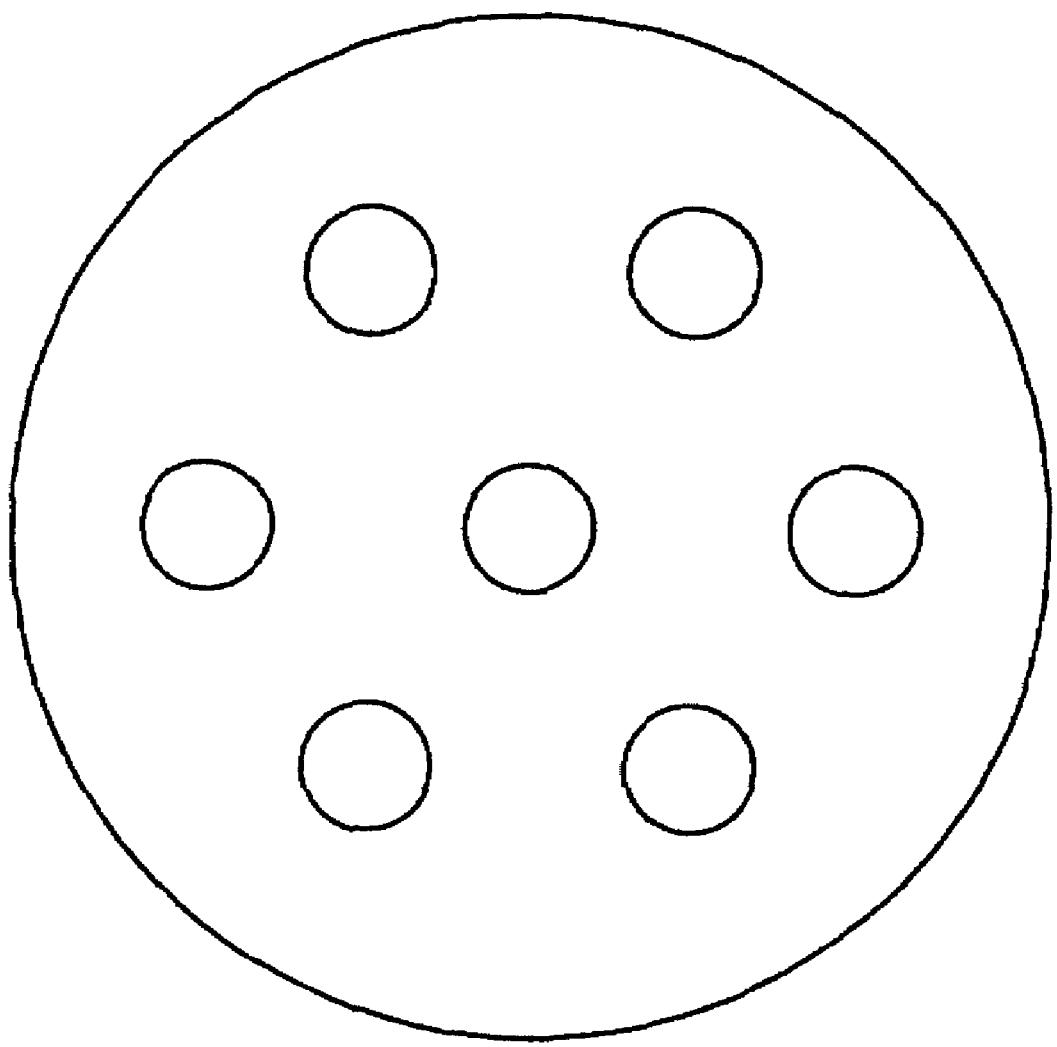
FIG. 9 is a top view of a non-linear mirror configuration for use in a multi-side measurement system according to one embodiment of the present invention.

FIG. 9 is a top view of a multi-side monitoring system. While an array of seven sites is shown, more or fewer sites can be used. The array can be non-linear (as shown in FIG. 9) or linear (as shown in FIGS. 6 and 7). The spacing between sites can be uniform or non-uniform and may vary with radius.

As an alternative to the processes depicted in FIGS. 5 and 8, the processing of a batch can be terminated mid-batch if the uniformity is not within prescribed limits. In such an embodiment, the system tracks which wafers still need to be processed when the wafer cartridge is reloaded.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

The invention claimed is:

1. A monitoring system for use in a plasma chamber, said monitoring system comprising:
    a microwave mirror having a first reflecting surface provided on an inner surface of a wall of the plasma chamber arranged opposite a substrate holder of the plasma chamber such that the first reflecting surface can be immersed in a plasma and the substrate holder or a substrate thereon or both provide a second reflecting surface, wherein said first and second reflecting surfaces provide a microwave resonator;

a non-plasma power source coupled to a first aperture in said first reflecting surface such that said power source provides a microwave signal extending along an axis generally perpendicular to a substrate plane and incident on a discrete area of the substrate plane which is only a portion of an entire area of a support surface of the substrate holder in order to monitor spatial resolution of electron density along the substrate plane;

a first microwave window provided on an outer surface of the wall of the plasma chamber that includes the reflecting surface such that the first microwave window is outside the plasma chamber and provided between the power source and the aperture;

a detector coupled to a second aperture of said first reflecting surface, said detector being configured to measure at least one resonant frequency of said microwave resonator; and a control system connected to said detector and configured to process said at least one signal, said control system being configured to determine an electron density from said at least one resonant frequency.

2. The monitoring system according to claim 1, wherein, said microwave mirror comprises a concave surface.

3. The monitoring system according to claim 2, wherein said microwave mirror is configured to provide said microwave beam as a converging beam.

4. The monitoring system according to claim 1, further comprising:

a second microwave window provided between said detector and said second aperture of said first reflecting surface, said second microwave window being adjacent to the first microwave window on the outer surface of the wall of the plasma chamber that includes the reflecting surface.

5. The monitoring system according to claim 4, wherein said first microwave window and said second microwave window comprise a dielectric material.

6. The monitoring system according to claim 4, wherein said first microwave window and said second microwave window comprise at least one of alumina, sapphire, aluminum nitride, quartz, polytetrafluoroethylene, and Kapton.

7. The monitoring system according to claim 1, further comprising a flange configured to mount said first microwave window to a the outer surface of the wall of the plasma chamber that includes the first reflecting surface.

8. The monitoring system according to claim 1, wherein said power source comprises a voltage controlled oscillator.

9. The monitoring system according to claim 1, wherein said detector comprises a diode detector.

10. The monitoring system according to claim 1, wherein said first reflecting surface comprises aluminum.

11. The monitoring system according to claim 1, wherein said first reflecting surface comprises an anodized surface.

12. The monitoring system according to claim 11, wherein said anodized surface is anodized with an anodization having a thickness in a range from 10 to 50 microns.

13. The monitoring system according to claim 1, wherein said first reflecting surface comprises a Yttria coating.

14. The monitoring system according to claim 1, wherein said control system comprises a lock-on circuit configured to lock a frequency of said microwave signal to a pre-selected resonance frequency, said lock-on circuit being configured to receive a detection signal from said detector and provide a corresponding error signal to said power source to adjust an output frequency of said microwave signal to said resonant frequency of the microwave resonator.

15. The monitoring system according to claim 14, wherein said control system further comprises a computer connected to said lock-on circuit.

16. The monitoring system of claim 1 wherein the power source is a microwave system of a high frequency exceeding the electron plasma frequency.

17. The monitoring system of claim 1 wherein the power source provides said microwave signal at a power of tens of milliwatts or less.

18. A plasma processing system comprising:

a plasma chamber having a substrate holder; and a monitoring system for use in said plasma chamber, said monitoring system comprising:

a microwave mirror having a concave surface, said microwave mirror provided within the plasma chamber on an inner surface of a wall of the plasma chamber so that the microwave mirror can be immersed in a plasma, said concave surface being located opposite said substrate holder to provide a microwave resonator, a non-plasma power source coupled to a first aperture in said microwave mirror such that said power source provides a microwave signal extending along an axis generally perpendicular to a substrate plane of said substrate holder in the plasma chamber and incident on a discrete area of the substrate plane which is only a portion of an entire area of a support surface of the substrate holder in order to monitor spatial resolution of electron density along the substrate plane, a first microwave window provided on an outer surface of the wall of the plasma chamber that includes the reflecting surface such that the first microwave window is outside the plasma chamber and provided between the power source and the aperture;

a detector coupled to a second aperture of said microwave mirror, said detector being configured to measure a vacuum resonance voltage corresponding to a resonant frequency of said microwave resonator, and a control system connected to said detector and configured to measure a first voltage during a vacuum condition and a second voltage during a plasma condition, said control system being configured to determine an electron density from the difference between said second voltage and said first voltage.

19. The plasma processing system according to claim 18, further comprising:

a second microwave window provided between said detector and said second aperture of said microwave mirror, said second microwave window being adjacent to the first microwave window on the outer surface of the wall of the plasma chamber that includes the reflecting surface.

20. The plasma processing system according to claim 18, wherein said control system comprises a lock-on circuit configured to lock a frequency of said microwave signal to a pre-selected resonance frequency, said lock-on circuit being configured to receive a detection signal from said detector and provide a corresponding error signal to said power source to adjust an output frequency of said microwave signal to said resonant frequency of the microwave resonator.

21. A plasma processing system of claim 18, further comprising:

a second monitoring system for use in said plasma chamber, said second monitoring system comprising:

a second microwave mirror having a concave surface, said second microwave mirror provided within the plasma chamber on said inner surface of a wall of the plasma chamber so that the microwave mirror can be immersed in a plasma, said concave surface being located opposite said substrate holder to provide another microwave resonator, a second non-plasma power source coupled to another aperture in said second microwave mirror such that said second power source provides a microwave signal extending along an axis generally perpendicular to the substrate plane of said substrate holder and incident on another discrete area of the substrate plane which is only a portion of the entire area of the support surface of the substrate holder, another microwave window provided on the outer surface of the wall of the plasma chamber such that the another microwave window is outside the plasma chamber and provided between the second power source and the another aperture;

a second detector coupled to said second microwave mirror, said second detector being configured to measure a vacuum resonance voltage of said microwave signal within the plasma chamber, and a second control system connected to said second detector and configured to measure another first voltage during a vacuum condition and another second voltage during a plasma condition, said second control system being configured to determine an electron density from a difference between said another second voltage and said another first voltage.

22. The plasma processing system according to claim 21, wherein said monitoring systems comprise microwave mirrors provided in a spatial array located opposite said substrate holder.

23. The plasma processing system according to claim 21, wherein said microwave mirrors are configured to provide respective microwave beams incident on respective discrete areas of the substrate plane.

24. The plasma processing system according to claim 21, further comprising:
a further microwave window provided between said second detector and said second microwave mirror.

25. The plasma processing system according to claim 21, wherein said second control system comprises a second lock-on circuit configured to lock a frequency of said microwave signal to a pre-selected resonance frequency, said second lock-on circuit being configured to receive a detection signal from said second detector and provide a corresponding error signal to said second power source to adjust an output frequency of said microwave signal to a frequency associated with a peak of a pre-selected longitudinal resonance.

26. The monitoring system of claim 18 wherein the power source is a microwave system of a high frequency exceeding the electron plasma frequency.

27. The monitoring system of claim 18 wherein the power source provides said microwave signal at a power of tens of milliwatts or less.

* * * * *